United States Patent [19]

Corrado

[11] 4,115,370

[45] Sep. 19, 1978

[54] UNSATURATED POLYESTERAMIDES, METHOD FOR THEIR PRODUCTION AND HARDENABLE RESINS PRODUCED FROM THE SAID POLYESTERAMIDES

[75] Inventor: Giovanni Corrado, Rome, Italy

[73] Assignee: Snia Viscosa Societa' Nazionale Industria Applicazioni Viscosa S.p.A., Italy

[21] Appl. No.: 657,268

[22] Filed: Feb. 11, 1976

[30] Foreign Application Priority Data

Feb. 21, 1975 [IT] Italy ............................ 20489 A/75

[51] Int. Cl.$^2$ ........................................ C08G 63/68
[52] U.S. Cl. ........................ 260/22 CQ; 260/22 CB; 260/857 PE; 260/857 G; 528/292
[58] Field of Search ........ 260/22 CQ, 22 CB, 47 CZ, 260/75 UA, 75 N, 398, 857 PE, 857 G, 861, 22 R

[56] References Cited

U.S. PATENT DOCUMENTS

| 2,547,113 | 4/1951 | Drewitt | 260/75 N |
|---|---|---|---|
| 3,333,021 | 7/1967 | Geipert | 260/863 |
| 3,502,602 | 3/1970 | Helm et al. | 260/75 N X |
| 3,511,792 | 5/1970 | Helm et al. | 260/75 UA X |

FOREIGN PATENT DOCUMENTS

| 1,366,354 | 11/1974 | United Kingdom | 260/78 R |
|---|---|---|---|
| 1,378,233 | 12/1974 | United Kingdom | 260/78 R |
| 927,786 | 6/1963 | United Kingdom | 260/75 R |
| 938,640 | 10/1963 | United Kingdom | 260/75 R |
| 1,113,264 | 5/1968 | United Kingdom | 260/75 R |
| 1,258,545 | 12/1971 | United Kingdom | 260/75 R |
| 1,278,651 | 6/1972 | United Kingdom | 260/78 R |
| 1,323,313 | 7/1973 | United Kingdom | 260/75 NT |

Primary Examiner—Lucille M. Phynes
Attorney, Agent, or Firm—McGlew and Tuttle

[57] ABSTRACT

The specification describes polyesteramide polymeric materials containing double bonds which are capable of cross-linking with vinyl or allyl monomers and to which the concurrent presence of ester and amide groups imparts particular characteristics. The specification also describes polyesteramide resins obtained by cross-linking the aforesaid polyesteramide materials with at least one vinyl monomer. The specification further describes a method for the production of the aforesaid polyesteramide materials by the polycondensation of compounds at least part of which comprises amino groups, which groups are already engaged in the amide bond and are not reactive with the double bonds. The specification finally describes fabricated objects, fibers, films and filaments obtained from the aforesaid unsaturated polyesteramide materials.

31 Claims, No Drawings

UNSATURATED POLYESTERAMIDES, METHOD FOR THEIR PRODUCTION AND HARDENABLE RESINS PRODUCED FROM THE SAID POLYESTERAMIDES

BACKGROUND OF THE INVENTION

1. Field of the Invention

This invention relates in general to the field of polymeric materials containing double bonds which are capable of cross-linking with vinyl or ally lmonomers for the purpose of obtaining, through the use of suitable catalysts, hardened resins suited to many uses.

2. Description of the Prior Art

This technological field in its actual industrial scope extends in practice only to the range of the unsaturated polyesters and their use for the production of a great variety of resins. The notoriety of said unsaturated polyesters, of the hardenable and hardened resins obtained by using the same, and of their industrial uses, makes it unnecessary to give any specific indication as to the very extensive technical and patent literature which relates to them.

However, in the specific field of the unsaturated polymeric compounds and the related resins, it is impossible to admit that for the same an analogy might exist with the field of saturated polymers, in which, besides the polyesters, there exist and are widespread the polyamides which present their own advantageous characteristics, and the polyesteramides which in a first approximation present properties that are intermediate between the polyesters and the polyamides and therefore have specific advantageous applications.

To complete this explanation of the premises of the invention, the fact may also be mentioned that various investigations have been carried out, without satisfactory results, to the end of obtaining unsaturated polyamides that would be more or less truly capable of yielding resins capable of hardening with the intervention of suitable catalysts.

Generally speaking, according to the known technology, such unsaturated polyamides may be obtained by following two methods:

1. — interface condensation between bicarboxylic acid chlorides and diamines;
2. — condensation between diacids and diamines in the heated state with elimination of water.

As to the first method the works of Mortillaro, Russo, Credali and Guidotti of Milano Research Center of Montedison (Italian Pat. Nos. 793,192, 793,191, 793,193 of 1967) and those of Lanzetta, Naglio, Marchetta and Palumbo of the C.N.R. Laboratories of Arco Felice (Naples) (Journal of Polymer Science Vol. II, 913-923 (1973)) are known in particular.

This system, however has the fundamental disadvantage of yielding high molecular weight polymers that are slightly soluble in vinyl and allyl monomers. For this reason, they are not usable for the purpose of obtaining resins that are capable of hardening with suitable catalysts and of being employed for diversified uses analogously to polyester resins.

As to the second method, French Pat. No. 1,578,317 (1970) of Schering Aktiengesellschaft is known in particular. By this method, the condensation reaction is carried out at temperatures around 100° C using maleic anhydride as the unsaturated component. Since at such temperatures the fumerization reaction cannot occur, the resin obtained by the solution of the unsaturated polyamide in vinyl or allyl monomers is not sufficiently reactive with normal peroxidic systems. On the other hand, the synthesis of unsaturated polyamides by direct condensation in the heated state cannot be carried out at temperatures much above 100° C due to the fact that under such conditions the amino groups rapidly attack the maleic or fumaric double bonds (these latter to a lesser degree). Further, the direct condensation of fumaric acid with diamines does not easily occur at the temperatures described in the above patent. This is due among other causes to the insolubility of fumaric acid in the reaction environment.

To sum up, it may thus be stated that the main obstacles to the production and the actual industrial application of unsaturated polyamides are due to the occurrence of the following conditions:

a. — attack of double bonds by amino groups
b. — low solubility of the polymers obtained
c. — low economic efficiency in particular in the case of a synthesis by interface condensation.

SUMMARY AND OBJECTS OF THE INVENTION

Now then, it is an object of the invention to provide a polyesteramide polymeric material characterized by the presence of double bonds which are capable of cross-linking with vinyl or allyl monomers, and to which material the ester and amide groups concurrently impart particular characteristics.

Said polymeric materials, more properly the unsaturated polyesteramides, according to the invention, permit to obtaining of hardened polyesteramide resins by cross-linking with one or more vinyl monomers, essentially under the conditions and according to the methods currently in use in the field of polyester resins, which unsaturated polyesteramides in view of the concurrent presence of ester and amide groups are possessed, to a selectively variable degree, of important characteristics and properties, among which are:

a. — high elongation at break under traction, often higher than that of polyesters having equal bending elasticity modulus, b. — resilience coupled with a good elongation under traction, c. — low density, d. — general chemical resistance which is noteworthy even for highly flexible resins, e. — low water absorbtion, f. — linear thermal dilatation coefficients which are high with respect to the values found for polyester resins.

If the above characteristics are taken into consideration it becomes evident that the uses to which the polyesteramides may be destined are numerous. This is particularly true in view of the fact that said resins cover a wide range of mechanical characteristics going from rigid resins through semirigid to flexible resins. The good chemical resistance coupled with the low water absorbtion and the resilience suggests the use of some of resins in question in the field of varnishes and gel coats. The resilience and the thermal behaviour direct some of these polyesteramide resins in particular to uses in the incapsulation of electric circuits and their support plates, this especially considering their good electrical characteristics.

The polyesteramide resins having particular resilience, chemical resistance and low water absorption may further be found excellent for the production of laminates and other structural products. Similarly the resilience, the chemical resistance and the low water absorption coupled to a good flexibility make the polyesteramides suitable for mixing with bis-phenol or isophthalic polyester resins as particularly interesting agents for making the resins flexible. The rigid polyesteramide resins, on the other hand, may find use in mixtures with solid monomers of the type of diacetoacrylamide and of triallylcyanurate for the purpose of obtaining particularly interesting resins usable for hot molding.

The advantages resulting from the low density of the hardened polyesteramides should also be taken into consideration. This feature permits the obtaining of lighter products than those obtained from polyesters when they are used in particular cases, such as the manufacture of floating hulls.

The unsaturated polyesteramides according to the invention are mainly characterized in that they are constituted by an unsaturated linear polymer which contains amide bonds, ester bonds and unsaturations, and in the chain of which there is at least one ester bond between amide bonds and unsaturations. Preferably, the ester bonds are at least two and the unsaturations derive from $\alpha$-$\beta$ unsaturated bicarboxylic acids. This condition, among other things, permits the overcoming of the main difficulty which is found in the synthesis of unsaturated polyamides, a difficulty which has been previously indicated by a), inasmuch as the unsaturated polyesteramide according to the invention can be obtained, as will be specified hereafter, with reference to the method for its production, by using and polycondensing compounds in which the amino group is already involved in the amide bond and is no longer reactive with double bonds.

More particularly, the unsaturated linear polyesteramide according to the invention is characterized in that it comprises, in its linear chain, units which in turn comprise a base sequence including a radical of a COOH — terminated saturated polyamide, a glycol radical, at least a radical of an $\alpha$-$\beta$ unsaturated bicarboxylic acid, and once again a glycol radical.

Other more specific conditions, together with their main variables, on the basis of which the unsaturated polyesteramide may be defined, will become evident in the course of the following detailed description of the method for its production, which is also an object of the invention.

Essentially, this method is characterized in that it comprises the polycondensation of a compound which characteristically comprises the said amino group engaged in the amide bond and which is terminated on both sides by a plurality of COOH groups, with another compound, or with the components of another compound, which is practically a polyester terminated on both sides by hydroxyls, the polycondensation reaction leading to obtaining the desired unsaturated linear polymer, or the desired unsaturated linear polyesteramide, the chain of which presents the structural characteristics stated above.

The method according to the invention comprises firstly the synthesis of at least a compound having the general formula

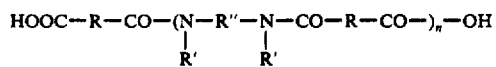  (1)

and successively its condensation with one or more compounds having the general formula

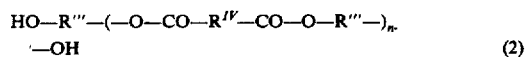  (2)

which compounds have also been synthesized previously, or with the separated components of the compounds (2) in equal or different rations, where in the formulae (1) and (2) $n$ and $n' \geq 1$, equal or different from one another; R represents an aliphatic radical having a linear or a branched chain, alone or together with an aromatic or cycloaliphatic radical; R' represents hydrogen or an aliphatic, cycloaliphatic or arylaliphatic radical; R'' represents an aliphatic, arylaliphatic or cycloalphatic radical; R''' represents an aliphatic radical having a linear or a branched chain, or a cycloaliphatic or arylaliphatic radical, and $R^{IV}$ is a radical derived from an $\alpha$-$\beta$ unsaturated bicarboxylic acid such as maleic acid or its anhydride, fumaric acid, citraconic acid or its anhydride, alone or together with aromatic, aliphatic or cycloaliphatic radicals.

The synthesis of the unsaturated polyesteramide, according to the invention, is in principle carried out in several phases. In a preliminary phase the compound or compounds having the formula (1) are synthesized and for this purpose a mixture is prepared consisting of one or more aliphatic saturated bicarboxylic acids (alone or, in turn, mixed with aromatic or cycloaliphatic bicarboxylic acids) and of one or more diamines in the molar ratio $(n+1):n$. A suitable catalyst may be added and the mixture is brought, under stirring and in an inert atmosphere, to temperatures between 100° and 300° C. When the amine number reaches the value zero there are added to the compound (1) thus prepared, the compound or compounds having the general formula (2), which have been previously synthesized together or separately, under the same conditions of the synthesis of (1), from bicarboxylic acids and glycols in the molar ratio $n':(n' + 1)$, or there are added the separate components of the compound or compounds (2) in equal or different ratios, but in such a way as to obtain in any case an overall molar ratio of 1:1 of carboxylic to hydroxyl groups. The addition is to be effected in an inert atmosphere and under stirring. Thereafter the mixture is brought to temperatures between 100° C and 300° C, always in an inert gas and under stirring. The reaction may be facilitated by the application of a vacuum, especially in the final phase. The reaction stops when the acid number reaches values approximately between 5 and 100 but preferably between 10 and 60. To complete the reaction a period between two and four hours is usually required. A very thick and viscous liquid having a colour from amber to reddish, or a yellow product having a waxy consistency, is thus obtained.

The unsaturated polyesteramide thus obtained may in general have molecular weights from 500 to 10,000, but preferably from 1000 to 4000, and a degree of unsaturation in the vicinity of 0.06 ÷ 0.12 double bond equivalents per 100 grams of polymer.

Coming now specifically to consider the formation of the compounds having the general formulae (1) and (2) set forth above, in the unsaturated polyesteramides according to the invention, —OC—R—CO— is a radical of bicarboxylic acids comprised in the following classes:

a. — Bicarboxylic acids having the general formula

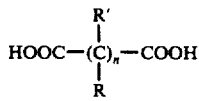

where n ≧ 1 and R and R' may be hydrogen or aliphatic, cycloaliphatic or arylaliphatic radicals, for example propanedioic, butanedioic, adipic, azelaic, sebacic, dodecanedioic acids, 1,8- and 1,9-heptanedicarboxylic acids, tall-oil dimer fatty acids, tetrahydrophthalic acid, chlorendic acid or its anhydride.

b. — Aromatic bicarboxylic acids such as for instance phthalic acid or its anhydride, isophthalic or terephthalic acids, tetrachloro and tetrabromophthalic acids and their anhydrides, etc.

Said bicarboxylic acids are employed, individually or mixed with one another, for the synthesis of the compound having the formula (1).

To the end of obtaining more soluble unsaturated polyesteramides, long chain acids such as adipic, azelaic, sebacic, dodecanedioic acids, or acids having a very long chain such as the EMPOL acids of UNILEVER and in general tall-oil dimer fatty acids, are preferred as bicarboxylic aliphatic acids.

In turn, α-β unsaturated bicarboxylic anhydrides or acids, such as maleic anhydride or acid, fumaric acid, citraconic anhydride or its acid, etc., or mixtures thereof with aromatic acids such as phthalic acid or anhydride, isophthalic acid, tetrabromo or tetrachlorophthalic acids or their anhydrides etc., or with aliphatic or cycloaliphatic acids such as chlorendic acid or its anhydride, tetrahydrophthalic acid or its anhydride, etc., are used as components of the compound or compounds having the general formula (2).

Coming now to consider the diamine radical,

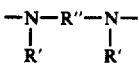

is a radical of diamines comprised in the following classes:

a. — Primary diamines having the general formula:

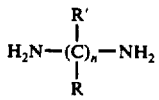

where $n \geq 2$ and R and R' may be hydrogen or aliphatic, cycloaliphatic or arylaliphatic radicals, such as for instance ethylenediamine, 1,3-propylenediamine, 1,4-butylenediamine, 1,6-diaminohexane, 1,12-dodecanediamine, the various isomers of trimethyldiaminohexane, 2,5-dimethylhexane-2,5-diamine, 4,4-diaminodicyclohexylmethane, 2-phenyl-1,5-diaminopenthane, etc.

b. — Aliphatic or cycloaliphatic secondary diamines such as 6-amino-1-methylaminohexane, the piperazines, 3-amino-1-cyclohexylaminopropane, isophoronediamine, etc.

c. — Aliphatic, cycloaliphatic and arylaliphatic diamines having ether bridges, such as for instance 4,9-dioxydodecane-1,12-diamine, etc.

d. — Aliphatic, cycloaliphatic or arylaliphatic diamines having nitrogen bridges, such as for instance bis(3-aminopropyl)-methylamine, etc.

Branched diamines, such as isophoronediamine or trimethylhexamethylene diamines, are also preferred for the purpose of obtaining more soluble unsaturated polyesteramides.

The glycols used in the synthesis of the compound or compounds having the general formula (2) may be of a diversified nature. In particular, —O—R'''—O— is a radical of glycols chosen in the following classes:

a. Linear or branched saturated aliphatic or cycloaliphatic glycols, such as for instance diethyleneglycol, 1,2-propyleneglycol, 1,3-propyleneglycol, the pentyleneglycols among which neopentylglycol, the various isomers of hexanediol, the trimethylhexanediols, 2,2-bis-(4,5-hydroxycyclohexyl)propane, the various cyclohexylglycols, TMPD glycol, cyclohexanedimethanol, etc.

b. — Arylaliphatic glycols such as for instance 1,1'-isopropylidene-bis(p-phenyloxy)-dipropanol-1,2,1,1'-isopropylidene-bis-(p-phenyloxy) diethanol, etc.

c. — Unsaturated aliphatic glycols such as for instance 1,2-butene-3,4-diol, 2,3-butene-1,4-diol, etc.

d. — Aliphatic or cycloaliphatic glycols having ether bridges such as for instance diethyleneglycol, triethyleneglycol, the polyethyleneglycols, dipropyleneglycol, the polipropyleneglycols, the polybutyleneglycols, etc. Such glycols are used individually or mixed with one another.

The unsaturated polyesteramides which are in object of this invention, where suitably inhibited and mixed with a vinyl or allyl monomer or mixtures thereof, yield resins which are capable of gelling and hardening through the use of the normal systems employed for unsaturated polyester resins. Such resins may be employed in uses which are analogous or even different from those of polyester resins. The monomers with which it is possible to mix the unsaturated polyesteramides are of different natures.

The resins are obtained by inhibition of the unsaturated polyesteramides described, with suitable amounts of inhibitors such as hydroquinone, t-butylhydroquinone, toluenehydroquinone, naphthoquinone, benzoquinone, nitrophenols, catechols, quaternary ammonium salts, etc. and are mixed with the desired amount of monomers or monomer mixtures belonging to the following classes:

a. — Vinyl monomers such as styrene, α-methylstyrene, chlorostyrene, etc.

b. — Allyl monomers such as diallylphthalate, triallylcyanurate, etc.

c. — Acryl monomers such as acrylic or methacrylic esters, diacetacrylamide, etc.

DESCRIPTION OF THE PREFERRED EMBODIMENTS

Some non limitative examples of the synthesis of polyesteramides as well some examples of the preparation of polyesteramide resins, where by "resins" is meant liquid or solid mixtures of the polymer with vinyl or allyl monomers, will now be set forth.

EXAMPLE 1 a. In a reaction flask provided with a mechanical stirrer, a descending cooler and a draw pipe, a mixture of 348 g. of fumaric acid and 637 g. of diethyleneglycol with the addition of a small amount (about 0.1%) of an esterification catalyst, is slowly heated to 180° C in an inert gas atmosphere and while distilling the reaction water. After about three hours of heating at the same temperature (180° C), when the acidity has reached the value zero, the reaction is stopped. 220 ppm of hydroquinone are added and a di-diethyleneglycol-fumarate is thus obtained which may be stored for a long time.

b. In a reaction vessel provided with a stirrer, a descending cooler and a draw pipe, a mixture of 181 g. of EMPOL 1014 very low chain acids (UNILEVER) and 25 g. of 2,4,4-trimethyl-1,6-diaminohexane, with the addition of 0.1% of a catalyst, are slowly heated to 160° C in an inert gas atmosphere and while distilling the reaction water. After about two hours at 160° C, when the amine number has reached the value zero, 47 g. of the di-diethylene-glycol-fumarate prepared under (a) are slowly added at that temperature, under stirring and in an inert gas atmosphere. The temperature is brought to 200° C and the mixture is left under such conditions until, after about three hours, the acid number has reached the value 20. In the last half hour of reaction a vacuum of 0.2 mm Hg has been applied.

An unsaturated polyesteramide having a reddish colour, which is very viscous and has acid number 20 and amine number 0, is thus obtained.

EXAMPLE 2

A mixture of 181 g. of EMPOL-1014 dimmer fatty acid of UNILEVER and 19 g. of 1,6-diaminohexane with the addition of 0.1% of a catalyst, is heated as described in example 1 under item (b). The temperature is brought to 190° C and is maintained for about two hours. When the amine number has reached the value zero, 43 g. of di-diethyleneglycol-fumarate prepared as in example 1 under item (a) are added. The temperature is brought to 220° C and the mixture is left in an inert gas atmosphere at such temperature for about 2 hours until the acid number has reached the value 35. An unsaturated polyesteramide with acid number 35 and amine number 0 is thus obtained.

EXAMPLE 3

A mixture of 169 g. of azelaic acid and 71 g. of 2,4,4-trimethyl-1,6-diaminohexane with the addition of 0.1% of a catalyst, is heated as described in example 1 under item (b). The mixture is brought to 200° C and is maintained at that temperature for one hour and an half. When the amine number has reached the value zero, the temperature is lowered to 160° C and 116 g. of the di-diethyleneglycol-fumarate prepared as in example 1 under item (a) are added. The temperature is brought back to 200° C for about 3 hours in an inert gas atmosphere. In the last 10 minutes a vacuum of 0.15 mmHg is applied. As soon as the acidity has reached the value 30 the heating is stopped and the vacuum is eliminated.

A red highly viscous liquid having acid number 30 and amine number 0 is thus obtained.

EXAMPLE 4

A mixture of 161 g. of dodecanedioic acid and 55 g. of 2,4,4-(4,2,2)-trimethyldiaminohexane with the addition of 0.1% of a catalyst is prepared in a reaction flask. The mixture is heated under the conditions described in example 1 under item b) to the temperature of 200° C. This temperature is maintained for two hours, at which time the amine number has reached the value zero. The temperature is brought to 170° C and 90 g. of di-diethyleneglycol-fumarate prepared as in example 1 under item (a) are added under stirring and in an inert gas atmosphere. The temperature is brought back to 200° C and is maintained for about 2 hours. In the last hour a vacuum of 0.3 mm Hg has been applied.

A red highly viscous unsaturated polyesteramide having acid number 35 and amine number 0 is thus obtained.

EXAMPLE 5

A mixture of 115 g. of dodocanedioic acid, 30 g. of phthalic anhydride and 55 g. of 2,4,4-trimethylediaminohexane, with the addition of small quantities of a catalyst, is heated under the said conditions of example 1 under item (b). The temperature is brought to 160° C. After two hours under such conditions, when the amine number has the value zero, 95 g. of di-diethyleneglycol-fumarate prepared as in example 1 under item a) are added, always in an inert gas atmosphere. The mixture is left under those conditions for three hours, at which time the reaction may be said to be complete.

A reddish viscous product with acid number 10 and amine number 0 is obtained.

EXAMPLE 6

161 g. of dodecanedioic acid and 41 g. of 1,6-diaminohexane with the addition of 0.1% of a catalyst are mixed in a reaction flask. The mixture is heated to 175° C in an inert gas atmosphere and under stirring. After 2 hours of heating at such temperature, when the amine number has reached the value zero, 97 g. of di-diethyleneglycol-fumarate prepared as in example 1 under item a) are added. The mixture is brought to 220° C and is maintained at that temperature for three hours in an inert gas atmosphere. In the last 20 minutes a vacuum of 0.15 mm Hg is applied.

An unsaturated polyesteramide having a waxy consistency with acid number 40 and amine number 0 is obtained.

EXAMPLE 7

A mixture of 92 g. of dodecanedioic acid, 45 g. of phthalic anhydride and 42 g. of 1,6-diaminohexane with the addition of 0.06% of a catalyst is heated as described in example 1 under item (b). The mixture is brought to 180° C and is maintained at such temperature for one hour and a half until the amine number has gone down to zero. At this point 97 g. of di-diethyleneglycol-fumarate prepared as in example 1 with item (a) are added under stirring and the mixture is brought to 200° C. The mixture is maintained at said temperature in an inert gas atmosphere for 3 hours, applying a vacuum in the last half hour.

The product obtained has acid number 20 and amine number 0.

EXAMPLE 8

161 g. of dodecanedioic acid and 74 g. of 4,9-dioxydodecane-1,12-diamine are reacted at 200° C as described in example 1 under item b). The mixture is maintained at 200° C for 2 hours, at which time the amine number has reached the value zero. The temperature is brought to 150° C and 74 g. of diethyleneglycol and 41 g. of fumaric acid are added. The temperature is brought to 210° C and the mixture is left under those conditions for 4 hours.

The product obtained has acid number 45 and amine number 0.

EXAMPLE 9

161 g. of dodecanedioic acid and 60 g. of isoforonediamine with the addition of small amounts of a catalyst are heated to 180° C in a reaction flask as described in example 1 under item (b). The reaction mixture is kept at 180° C for two hours, at which time the amine number reaches the value zero. At this point 74 g. of diethyleneglycol and 41 g. of fumaric acid are added with stirring and in an inert gas atmosphere. The reaction mixture is maintained at 180° C for 3 hours.

A polyesteramide having acid number 30 and amine number 0 is obtained.

EXAMPLE 10

138 g. of dodecanedioic acid are reacted at 190° C as described in example 1 under item (b) with 63 g. of 2,4,4-trimethyl-1,6-diaminohexane. After one hour and a half, at which time the amine number has the value zero, there are added, still with stirring and in an inert gas atmosphere, 57 g. of di-diethyleneglycol-fumarate prepared as in example 1. The reaction mixture is maintained at 190° C for 3 hours. In the last ten minutes a vacuum of 0.3 mm Hg is applied.

The product obtained has acid number 35 and amine number 0.

EXAMPLE 11

In a reaction flask provided with a descending refrigerator, a mechanical stirrer and a draw pipe, 161 g. of dodecanedioic acid are mixed with 55 g. of 2,4,4-trimethyl-1,6-diaminohexane and 0.1% of a catalyst. The mixture is heated to 200° C with stirring and in an inert gas atmosphere. After two hours at said temperature, at which point the amine number goes down to zero, the mixture is brought to 170° C and 68 g. of di-diethyleneglycol-fumarate prepared as in example 1 under item (a) are added still under stirring and in an inert gas atmosphere. The reaction mixture is brought back to 200° C and is left at such temperature for 2½ hours. In the last half hour a vacuum of 0.2 mm Hg is applied.

A highly viscous liquid having acid number 50 and amine number 0 is thus obtained.

EXAMPLE 12

92 g. of dodecanedioic acid are heated as described in example 11 with 44 g. of phthalic anhydride and 55 g. of 2,4,4-trimethyl-1,6-diaminohexane with the addition of 0.1% of a catalyst. The reaction mixture is brought to 200° C and is kept at said temperature for 2 hours. The temperature is lowered to 160° C and 102 g. of di-diethyleneglycol-fumarate prepared as described in example 1 are added with stirring and in an inert gas atmosphere. The temperature is brought back to 200° C and the mixture is kept under such conditions for three hours. In the last hour a vacuum of 0.2 mm Hg is applied.

A product having acid number 20 and amine number 0 is obtained.

EXAMPLE 13 a. — In a reaction flask provided with a descending refrigerator, a mechanical stirrer and a draw pipe, 294 g. (3 mols) of maleic anhydride and 962 g. (6 mols) of 2,4,4-trimethyl-1,6-hexanediol are mixed. The mixture is slowly heated to 190° C while maintaining it under stirring and in an inert gas atmosphere. The reaction mixture is kept at 190° until the acid number goes down to zero. The temperature is lowered to 135° C and 200 ppm of hydroquinone are added.

b. — 90 g. of dodecanedioic acid and 31 g. of 2,4,4-trimethyl-1,6-diaminohexane are mixed in a reaction flask provided with a descending refrigerator, a mechanical stirrer and a draw pipe. The mixture is slowly heated up to 200° C in an inert gas atmosphere and under stirring. After two hours of reaction at 200° C the amine number reaches the value zero. The temperature is lowered to 170° C and 79 g. of di-trimethylhexanediol-fumarate prepared as under item a) are added. The mixture is brought to 22° C and is left for three hours at that temperature with stirring and in an inert gas atmosphere. In the last quarter of an hour a vacuum of 0.5 mm Hg is applied.

The product obtained has acid number 35 and amine number 0.

EXAMPLE 14 a. — 348 g. of fumaric acid and 805 g. of di-propyleneglycol with the addition of 0.1% of an esterification catalyst are heated as described in example 1. The reaction mixture is brought to 180° C. The mixture is maintained at that temperature for two hours, until the acid number goes down to zero.

b. — 161 g. of dodecanedioic acid and 55 g. of 2,4,4-trimethyl-1,6-diaminohexane are reacted as described in example 1. The reaction mixture is maintained at 190° C for 2 hours, at which time $N_{NH_2} = 0$. At this point 122 g. of the di-propyleneglycol-fumarate prepared under a) are added and the mixture is brought to the temperature of 210° C. The mixture is maintained at that temperature and in an inert gas atmosphere for three hours. In the last half hour a vacuum of 0.1 mm Hg is applied.

A red viscous liquid having acid number 50 and amine number 0 is obtained.

EXAMPLE 15 a. — 348 g. of fumaric acid are reacted at 180° C as in example 1 under item a) with 507 g. of propyleneglycol. The reaction mixture is maintained at 180° C until the acid number reaches the value zero.

b. — 161 g. of dodecanedioic acid and 55 g. of 2,4,4-trimethyl-1,6-diaminohexane with the addition of 0.1% of a catalyst are heated as in example 1 under item (b). The mixture is brought to 200° C and is kept at that temperature for 2 hours, at which point the amine number reaches the value zero. 81 g. of dipropyleneglycol-fumarate prepared as under (a) are added and the temperature is kept at 200° C for 3 hours.

The product obtained has acid number 45 and amine number 0.

EXAMPLE 16 a. — 318 g. of diethyleneglycol and 174 g. of fumaric acid with the addition of 0.1% of a catalyst are reacted in an inert gas atmosphere and at a temperature of 180° C. The mixture is kept at 180° C for 1½ hours, at which time the acid number reaches the value zero.

b. — 318 g. of diethyleneglycol and 222 g. of phthalic anhydride with the addition of 0.1% of an esterification catalyst are reacted at 180° C as in (a). The mixture is kept at 180° C for 2 hours, at which time the acid number has the value 0.

c. — 161 g. of dodecanedioic acid and 55 g. of 2,4,4-trimethyl-1,6-diaminohexane with the addition of 0.1% of a catalyst are mixed in a reaction flask provided with a stirrer, a descending refrigerator and a draw pipe. The mixture is heated under an inert gas up to 200° C. It is kept at said temperature for 2 hours, at which time $N_{NH_2} = 0$. At this point there are added 51 g. of the di-diethyleneglycol-fumarate prepared in a) and 60 g. of the di-diethyleneglycol-phthalate prepared in (b). The temperature is maintained at 200° C for 3 hours. In the last half hour a vacuum of 0.3 mm Hg is applied.

The product obtained has acid number 30 and amine number 0.

EXAMPLE 17 a. — 348 g. of fumaric acid and 624 g. of neopentylglycol with the addition of 0.1% of an esterification catalyst are reacted at 190° C as described in example 16 under item (a). The mixture is kept at 198° C for 2 hours, at which time the acid number reaches the value zero.

b. — 161 g. of dodecanedioic acid and 55 g. of 2,4,4-trimethyl-1,6-diaminohexane with the addition of small amounts of a catalyst are heated at 190° C as described in example 1 under item (b). The mixture is kept at 190° C for 2 hours until the amine number zero is reached. 102 g. of the di-neopentylglycol-fuma rate prepared in (a) are added. The mixture is brought to 200° C and is kept at that temperature in an inert gas atmosphere for 2½ hours. In the last quarter of an hour a vacuum of 0.2 mm Hg is applied.

A polyesteramide is obtained with acid number 25 and amine number 0.

EXAMPLE 18 a. — 174 g. of fumaric acid with 249 g. of isophthalic acid and 637 g. of diethyleneglycol are reacted in a nitrogen atmosphere and under stirring. The temperature is maintained at 180° C for 2 hours, at which time the acid number reaches the value 0.

b. — 161 g. of dodecanedioic acid and 55 g. of 2,4,4-trimethyl-1,6-diaminohexane with the addition of 0.1% of a catalyst are mixed in a flask provided with a descending refrigerator, a stirrer and a draw pipe. The mixture is slowly heated under stirring and in an inert gas atmosphere to 200° C. After 2 hours the amine rubber reaches the value zero and the temperature is lowered to 170° C. At this point 111 g. of the substrate prepared as in (a) are added and the temperature is brought back to 200° C. The mixture is kept at that temperature in an inert gas atmosphere for three hours. In the last hour a vacuum of 0.5 mm Hg is applied.

A product with acid number 20 and amine number 0 is obtained.

In the table attached thereto there are listed the essential characteristics of a number of resins prepared in identical ways, to assure the consistency of the comparison, by the use of a part of the unsaturated polyesteramides, which in turn have been obtained by operating according to what is described in the foregoing examples. These unsaturated polyesteramides have all been treated by inhibiting them with 200 parts per million (ppm) of hydroquinone and dissolving them in styrene at a concentration of 50%. Said resins have been hardened with 2% of benzoylperoxide paste for 12 hours at 70° C and post-hardened for two hours at 100° C.

The data listed have been obtained according to the UNI and ISO standards.

| Example No. | Elongation at break % | Breaking load under traction kg/cm² | Bending elastic modulus kg/cm² | Bending yield load kg/cm² | Shock resistance kg/cm | Water absorption in 24 h % | Linear thermal dilatation U/° C | Deflection temperature under load ° C |
|---|---|---|---|---|---|---|---|---|
| 1 | 120 | 250 | 6.000 | — | 45 | 0.10 | $13.10^{-4}$ | 41 |
| 3 | 80 | 400 | 9.000 | — | 42 | 0.12 | $12.10^{-4}$ | 46 |
| 4 | 80 | 250 | 8.000 | — | 50 | 0.15 | $16.10^{-4}$ | 45 |
| 13 | 60 | 300 | 9.000 | — | 62 | 0.10 | — | 50 |
| 14 | 40 | 400 | 11.000 | 700 | 60 | 0.12 | — | 58 |
| 15 | 40 | 350 | 12.000 | 800 | 80 | 0.10 | — | 51 |
| 16 | 120 | 250 | 5.000 | — | 70 | 0.12 | — | 39 |
| 17 | 40 | 400 | 11.000 | 800 | 70 | 0.10 | — | 53 |
| 18 | 200 | 250 | 4.000 | — | 65 | 0.10 | — | 44 |

Obviously, these resins may be prepared by following various modes of operation and procedures. As a demonstration of such possibilities there are described hereinafter further non limitative examples of the preparation of polyesteramide resins obtained by using unsaturated polymers chosen among those produced in turn according to some of the preceding examples.

EXAMPLE 19

In a flask provided with a mechanical stirrer and a draw pipe 500 g. of the unsaturated polyesteramide obtained as in example 4 are heated to melting at 135° C and in an inert atmosphere. 0.2 g. of hydroquinone are added under stirring. The mixture is kept under stirring for a quarter of an hour at 135° C. The temperature is brought to 115° C and 500 g. of styrene are added.

EXAMPLE 20

In a flask provided with a stirrer and a draw pipe 600 g. of the unsaturated polyesteramide obtained as in example 6 are heated to melting at 150° C and in an inert atmosphere. 0.25 g. of toluenehydroquinone are added under stirring. The mixture is kept under stirring for a quarter of an hour at 150° C. The temperature is brought to 130° C and 400 g. of diacetoneacrylamide are added.

EXAMPLE 21

500 g. of the unsaturated polyesteramide obtained as in example 14 are heated to 140° C in an inert atmosphere. 0.3 g. of hydroquinone are added with stirring. The mixture is then brought to 120° C and 300 g. of styrene and 200 g. of diallylphthalate are added.

EXAMPLE 22

500 g. of the unsaturated polyesteramide prepared as in example 14 are heated to 135° C in an inert atmosphere. 0.25 g. of ter-butylhydroquinone are added under stirring. The mixture is kept under stirring for half hour at 135° C. The temperature is brought to 115° C and 500 g. of styrene are added.

EXAMPLE 23

600 g. of the unsaturated polyesteramide prepared as in example 16 are heated to 140° C in an inert atmosphere. 0.3 g. of hydroquinone are added under stirring. The mixture is kept under stirring for a half hour at 140° C. The temperature is brought to 130° C and 200 g. of styrene and 400 g. of triallylcyanurate are added.

I claim:

1. Unsaturated polyesteramide composition which comprises an unsaturated linear polymer having ester bonds and unsaturations, and radicals of a COOH-terminated saturated polyamide in its linear chain, said ester bonds being located between the amide bonds of the polyamide radical and the unsaturations and in the chain wherein ester bonds are present, said ester bonds are located between the amide bonds and the unsaturations.

2. Unsaturated polyesteramide composition according to claim 1, wherein the linear chain units of said composition are arranged in a base sequence including a COOH-terminated saturated polyamide radical, a glycol radical, at least a radical of an α-β unsaturated bicarboxylic acid, and once again a glycol radical.

3. Method for the production of an unsaturated polyesteramide composition having radicals of a COOH-terminated saturated polyamide in its linear chain, said ester bonds being located between the amide bonds of the polyamide radical and the unsaturations; ester bonds and unsaturations, and said ester bonds are located between the amide bonds and the unsaturations which comprises polycondensation of compounds at least part of which comprise amino groups, which groups are already engaged in the amide bond and are not reactive with the unsaturation of the double bonds.

4. Method according to claim 3 wherein at least compound is preferred according to the general formula

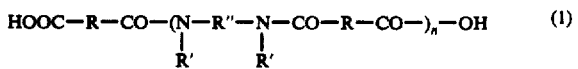

and by its condensation with at least one second compound according to the general formula

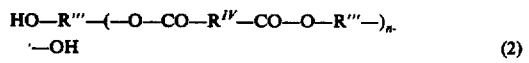

wherein
R is a linear or branched chained aliphatic radical, alone or together with an aromatic or cycloaliphatic radical; R' is hydrogen or an aliphatic, cycloaliphatic or arylaliphatic radical; R" is an aliphatic, arylaliphatic or cycloaliphatic radical; R'" is a linear or branched chain aliphatic radical, or cycloaliphatic or arylaliphatic radical, and $R^{IV}$ is a radical derived from an α-β unsaturated bicarboxylic acid such as maleic acid and its anhydride, fumaric acid, citraconic acid or its anhydride, alone or together with aromatic, aliphatic or cycloaliphatic radicals, and n and n' are each equal to 1 or greater than 1.

5. Method according to claim 4, characterized in that the compound having the general formula (1) is condensed with separate components of the compounds having the general formula (2).

6. Method according to claim 4, characterized in that n and n' are different from 1.

7. Method according to claim 4, characterized in that n and n' are equal to one another.

8. Method according to claim 4, characterized in that n and n' are different from one another.

9. Method according to claim 4, characterized in that the synthesis of the compound having the formula (1) is effected starting from a mixture of the saturated bicarboxylic acids and the diamines in the molar ratio (n + 1):n.

10. Method according to claim 9, characterized in that the said mixture also comprises aromatic or cycloaliphatic bicarboxylic acids.

11. Method according to claim 9, characterized in that the said first compound is synthesized by treating the same mixture, which may be catalyzed, under stirring, in an inert atmosphere and at a temperature between about 100° and 300° C, until the amine number reaches the value zero.

12. Method according to claim 4, characterized in that the synthesis of the second component having the formula (2) is effected from unsaturated bicarboxylic acids and glycols in a molar ratio n':(n'+1).

13. Method according to claim 4, characterized in that the condensation is effected between compounds having the formula (1) and compounds having the formula (2) in such ratios as to assure an overall molecular ratio close to 1:1 of carboxyl to hydroxyl groups.

14. Method according to claim 5, characterized in that the condensation effected between compounds having the formula (1) and separate components of the compound having the formula (2), is carried out, independently of the value of ratios of said components, in such way to assure an overall molar ratio close to 1:1 of carboxyl to hydroxyl groups.

15. Method according to claim 13, characterized in that the polycondensation reaction is effected in an inert atmosphere, under stirring, and at a temperature from about 100° C to 300° C.

16. Method according to claim 13, characterized in that the final phase of the polycondensation reaction is carried out under a vacuum.

17. Method according to claim 4, characterized in that the polycondensation reaction is stopped when the acid number reaches a value from 5 to 100.

18. Method according to claim 16, characterized in that the reaction is stopped when the acid number reaches a value from 10 to 60.

19. Method according to claim 4, characterized in that in the said compounds —OC—R—CO— is a radical of bicarboxylic acids chosen between:

a. — Bicarboxylic acids having the general formula:

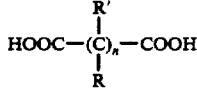

where $n \geq 1$ and R and R' may be hydrogen or aliphatic, or arylaliphatic radicals, for example propanedioic, butanedioic, adipic, azelaic, sebacic, dodecanedioic acids, 1,8 and 1,9-heptanedicarboxylic acids, talloil dimer fatty acids, tetrahydrophthalic acid, chlorendic acid or its anhydride;

b. Aromatic bicarboxylic acids such as for instance phthalic acid or its anhydride, isophthalic or terephtalic acids, tetrchloro and tetrabromophthalic acids and their anhydrides.

20. Method according to claim 19, characterized by the use of a plurality of the said bicarboxylic acids mixed with one another.

21. Method according to claim 4, characterized in that the said compounds

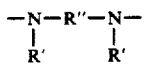

is a radical of an amine chosen among:
a. — Primary diamines having the general formula:

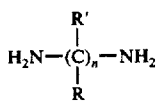

where $n \geqq$ and R and R' are hydrogen or aliphatic, cycloaliphatic or arylaliphatic radicals such as ethylenediamine, 1,3-propylenediamine, 1,4-butylenediamine, 1,6-diaminohexane, 1,12 dodecanediamine, isomers of trimethyldiaminohexane, 2,5 dimethylhexane-2,5-diamine, 4,4-diaminocyclohexylmethane, 2-phenyl-1,5-diaminopentane;

b. — Aliphatic or cycloaliphatic secondary diamines such as 6-amino-1-methylaminohexane, the piperazines, 3-amino-1-cyclohexylaminopropane, isophoronediamine;

c. — Aliphatic, cycloalophatic and arylaliphatic diamines having either bridges, such as for instance 4,9-dioxydode cane-1,12-diamine;

d. — Aliphatic, cycloaliphatic or aryliphatic diamines havong nitrogen bridges, such as for instance bis-(3-aminopropyl)methylamine, for the synthesis of the said compound having the formula (1).

22. Method according to claim 21, characterized by the use for synthesis, of a mixture of the said diamines.

23. Method according to claim 4, characterized in that—O—R'''—O—is a radical of glycols chosen in the following classes:

a. — Linear or branched saturated aliphatic or cycloaliphatic glycols, comprising diethyleneglycol, 1,2-propyleneglycol, 1,3- propyleneglycol, the various isomers of butyleneglycol, the pentyleneglycols among which neopentylglycol, various isomers of hexanediol, the trimethylhexanediols, 2,2-bis-(4-hydroxycyclohexyl)propane, the various cyclohexylglycols, TMPD glycol, cyclohexanedimethanol, b. — Arylaliphatic glycols comprising 1,1'-isopropylidene-bis-(p-phenylenoxy)-dipropanol,2, 1,1'-isopropylidene-bis-(p-phenyloxy)diethanol etc., c. — Unsaturated aliphatic glycols comprising 1,2-butene-3,4-diol, 2,3-butene-1,4-diol, d. — Aliphatic or cycloaliphatic glycols having ether bridges comprising diethyleneglycol, triethyleneglycol, the polyethyleneglycols, the dipropyleneglycols, the polypropyleneglycols, the polybutyleneglycols.

24. Method according to claim 23, characterized by the use of a mixture of the said glycols.

25. Method according to claim 4, characterized in that —OC—R$^{IV}$—CO—is a radical of $\alpha \approx \beta$ unsaturated bicarboxylic acids including maleic acid or its anhydride, fumaric acid, citraconic acid or its anhydride.

26. Method according to claim 25, characterized by the use of the said unsaturated bicarboxylic acids mixed with one or more saturated bicarboxylic acids, chosen among those indicated in claim 19.

27. Polyesteramide resin according to claim 1, characterized in that it is obtained from the mixture of an unsaturated polyesteramide with monomers or mixtures of monomers belonging to the following classes:

a. — Vinyl monomers such as styrene, α-methylstyrene, chlorostyrene, b. — Allyl monomers such as diallylphthalate, triallyl-cyanurate.

c. — Acrylic monomers such as acrylic or methacrylic esters, diacetoneacrylamide.

28. Unsaturated polyesteramide consisting essentially of the product of the polycondensation of an amide and an unsaturated ester, the amide consisting essentially of a diamine moiety chosen from the group consisting of ethylenediamine, 1,3-propylenediamine, 1,4-butylenediamine, 1,6-diamino-hexane, 1,12-dodecanediamine, the trimethyldiaminohexanes, 2,5 dimethylhexane-2,5-diamine, 4,4-diaminodicyclohexylmethane, 2-phenyl-1,5-diaminopentane, 6-amino-1-methylaminohexane, the piperazines, 3-amino-1-cyclohexylaminopropane, isophorodediamine, 4,9-dioxydodecane-1,12 -diamine, bis(3-aminopropyl)-methylamine and the trimethylhexamethylene diamines, and an acid moiety chosen from the group consisting of propanedioic, butanedioic, adipic, azelaic, sebacic, dodecanedioic acids 1,8- and 1,9-heptanedicarboxylic acids, talloil dimer fatty acids, tetrahydrophthalic acid, chlorendic acid and its anhydride, phthalic acid and its anhydride, isophthalic, terephthalic, tetrachlorophthalic, and tetrabromophthalic acids and their anhydrides, and the unsaturated ester consisting essentially of a glycol moiety chosen from the group consisting of 1,2-propyleneglycol, 1,3-propyleneglycol, the pentyleneglycols, the hexanediols, the trimethylhexanediols, 2,2-bis-(4,5-hydroxycyclohexyl) propane, the cyclohexylglycols. TMPD glycol, cyclohexanedimethanol, 1,1-isopropylidene-bis(p-phenyloxy)-dipropanol-1,2, 1,1'-isopropylidene-bis(p-phenyloxy)-diethanol, 1,2-butene-3,4-diol, 2,3-butene-1,4-diol, diethyleneglycol, triethyleneglycol, the polyethyleneglycols, dipropyleneglycol, the polypropyleneglycols and the polybutyleneglycols, and an unsaturated acid moiety chosen from the group consisting of maleic acid, maleic anhydride, citraconic acid, and citraconic anhydride, and mixtures thereof with at least a further acid component chosen from the group consisting of phthalic acid, isophthalic acid, tetrabromophthalic acid, tetrachlorophthalic acid, chlorendic acid, tetrahydrophthalic acid, and the anhydrides of the aforementioned acids.

29. Method for the production of an unsaturated polyesteramide, comprising the steps of reacting in a first stage at least an acid component chosen from the group consisting of propanedioic, butanedioic, adipic, azelaic, sebacic, dodecanedioic acids, 1,8- and 1,9-heptanedicarboxylic acids, talloil dimer fatty acids, tetrahydrophthalic acid, chlorendic acid and its anhydride, phthalic acid and its anhydride, isophthalic, terephthalic, tetrachlorophthalic, and tetrabromophthalic acids and their anhydrides, with at least one diamine chosen from the group consisting of ethylenediamine, 1,3- propylenediamine, 1,4-butylenediamine, 1,-6-diaminohexane, 1,12 -dodecane-diamine, the trimethyldiaminohexanes, 2,5 dimethylhexane-2,5-diamine, 4,4-diaminocicyclohexylmethane, 2-phenyl-1,5-diaminopentane, 6-amino-1-methylamino-hexane, the piperazines, 3-amino-1-cyclohexylaminopropane, isophorodediamine, 4,9-dioxydodecane-1,12-diamine, bis(3-aminopropyl)-methylamine and the trimethyl-hexa-methylene diamines; and in a second stage further reacting at least one unsaturated acid component chosen from the group consisting of maleic acid, maleic anhydride, citraconic acid, and citraconic anhydride, and mixtures thereof with at least one further acid component chosen from the group consisting of phthalic acid, and the anhydrides of the aforementioned acids, with at least one glycol chosen from the group consisting of 1,2-propyleneglycol, 1,3-propyleneglyciol, the pentyleneglycols, the hexanediols, the trimethyl-hexanediols, 2,2-bis-(4,5-hydroxycyclohexyl)propane, the cyclohexylglycols, TMPD glycol, cyclohexanedimethanol, 1,1-isopropylidene-bis(p-phenyloxy)-dipropanol-1,1'-isopropylidene-bis-(p-phenyloxy)diethanol, 1,2-butene-3,4-diol, 2,3-butene-1, 4-diol, diethyleneglycol, triethyleneglycol, the polyethyleneglycols, dipropyleneglycol, the polypropyleneglycols and the polybutyleneglycols, and polycondensing together the products of the aforesaid first and second reaction stages.

30. Method for the production of an unsaturated polyesteramide, comprising the steps of reacting in a first stage at least one acidic component chosen from the group consisting of propanedioic, butanedioic, adipic, azelaic, sebacic, dodecanedioic acids, 1,8-and 1,9-heptanedicarboxylic acids, talloil dimer fatty acids, tetrahydrophthalic acid, chlorendic acid and its anhydride, phthalic acid and its anhydride, isophthalic, terephthalic, tetrachlorophthalic, and and tetraboromophthalic acids and their anhydrides, with at least one diamine chosen from the group consisting of ethylenediamine, 1,3-propylenediamine, 1,4-butylenediamine, 1,6-diaminohexane, 1,12-dodecanediamine, the trimethyldiaminohexanes, 2,5 dimethylhexane-2,5-diamine, 4,4-diaminodicylohexylmethane, 2-phenyl-1,5-diaminopenthane, 6-amino-1-methyl aminohexane, the piperazines, 3-amino-1-cyclohexylaminopropane, isophorodediamine, 4,9-dioxydodecane-1,12-diamine, bis (3-aminopropyl)-methylamine and the trimethyl-hexamethylene diamines; and in a second stage polycondensing the product of the aforesaid first reaction stage with at least one unsaturated acid component chosen from the group consisting of maleic acid, maleic anhydride citraconic acid and citraconic anhydride, and mixtures thereof with at least a further acid component chosen from the group consisting of phthalic acid, isophthalic acid, tetrabromophthalic acid, tetrachlorophthalic acid, chlorendic acid, tetrahydrophthalic acid, and the anhydrides of the aforementioned acids, and with at least one glycol chosen from the group consisting of 1,2-propyleneglycol, 1,3-propyleneglycol, the pentyleneglycols, the hexanediols, the trimethylhexandiols, 2,2-bis-(4,5-hydroxycyclohexyl) propane, the cyclohexylglycols, TMPD glycol, cyclohexanedimethanol, 1,1-isopropylidene-bis(p-phenyloxy)-dipropanol-1,2, 1,1'-isopropylidene-bis(p-phenyloxy) diethanol, 1,2-butene-3,4-diol, 2,3-butene-1, 4-diol, diethyleneglycol, triethyleneglycol, the polethyleneglycols, dipropyleneglycol, the polypropyleneglycols and the polybutyleneglycols.

31. Polyesteramide resin according to claim 27, wherein the unsaturated polyestermaide composition contains at least one inhibitor selected from the group consisting of hydroquinone, t-butylhydroquinone, nitrophenols, catechols, and quaternary ammonium salts,

* * * * *